(12) United States Patent
Taniguchi et al.

(10) Patent No.: US 6,402,011 B1
(45) Date of Patent: Jun. 11, 2002

(54) REFLOW METHOD AND REFLOW DEVICE

(75) Inventors: Masahiro Taniguchi, Hirakata; Kazumi Ishimoto, Katano; Koichi Nagai, Hirakata; Osamu Yamazaki, Toyonaka; Tatsuaki Kitagawa, Fukushima; Osamu Matsushima, Fukushima; Kazuhiro Uji, Fukushima; Seizo Nemoto, Nihonmatsu, all of (JP)

(73) Assignee: Matsushita Electric Industrial Co., Ltd. (JP)

( * ) Notice: Subject to any disclaimer, the term of this patent is extended or adjusted under 35 U.S.C. 154(b) by 0 days.

(21) Appl. No.: 09/633,293

(22) Filed: Aug. 4, 2000

Related U.S. Application Data

(62) Division of application No. 08/835,989, filed on Apr. 11, 1997, now Pat. No. 6,145,734.

(30) Foreign Application Priority Data

Apr. 16, 1996 (JP) .............................................. 8-93710
Aug. 6, 1996 (JP) ............................................. 8-206735

(51) Int. Cl.[7] ............................. B23K 31/02; F27D 9/00
(52) U.S. Cl. ...................... 228/180.1; 228/200; 228/46; 432/10
(58) Field of Search ..................... 228/180.1, 180.21, 228/180.22, 200, 234.1, 46; 219/388, 391, 395; 432/121, 122, 31, 10

(56) References Cited

U.S. PATENT DOCUMENTS 3,904,102 A * 9/1975 Chu et al.
4,771,929 A * 9/1988 Bahr et al.
4,951,401 A * 8/1990 Suzuki et al.
5,128,506 A 7/1992 Dahne et al. ............ 219/85.13
5,232,145 A * 8/1993 Alley et al.
5,322,209 A 6/1994 Barten et al. ................ 228/183
5,338,008 A * 8/1994 Okuno et al.
5,579,981 A * 12/1996 Matsumura et al.
5,993,500 A * 11/1999 Bailey et al.
6,123,247 A * 9/2000 Shibo et al.
6,123,250 A * 9/2000 De Klein et al.
6,168,064 B1 * 1/2001 Berkin

FOREIGN PATENT DOCUMENTS

JP           403008391 A   *  1/1991
JP           404200860 A   *  7/1992
JP           7-73790          8/1995

OTHER PUBLICATIONS

Patent Abstracts of Japan, vol. 15, No. 85 (M–1087), Feb. 27, 1991 & JP 02 303674 A (Matsushita Electric Ind. Co.), Dec. 17, 1990, *abstract*.

* cited by examiner

*Primary Examiner*—Tom Dunn
*Assistant Examiner*—Kiley Stoner
(74) *Attorney, Agent, or Firm*—Parkhurst & Wendel, L.L.P.

(57) ABSTRACT

For reflow soldering, radiant heating is applied to one surface of a printed circuit board on which electronic components are placed and onto which cream solder is supplied and at the same time hot air is blown locally and roughly perpendicular to to-be-connected points on said one surface of the printed circuit board. This reflow method permits secure soldering even if the hot air is set at a temperature not exceeding the heat resistance of the electronic components, which is possilbe because of its combination with the radiant heat. Moreover, this reflow method can permit soldering in such a manner that only the to-be-connected points are heated selectively, because the hot air is blown locally and roughly perpendicular to the points to be connected. Thus, this reflow method prevents heat damage to other sections than the to-be-connected points and ensures that the solder at the to-be-connected points is melted.

2 Claims, 9 Drawing Sheets

REFLOW METHOD AND REFLOW DEVICE

This application is a divisional of Ser. No. 08/835,989 filed Apr. 11, 1997 now U.S. Pat. No. 6,145,734.

TECHNICAL FIELD

The present invention relates to a reflow method and reflow device wherein, by heating a printed circuit board on which electronic components are loaded and to which solder cream has been applied at locations to be connected, solder is melted and electronic components soldered.

BACKGROUND ART

A variety of methods for reflow soldering technology to mount electronic components on printed circuit boards are already known. These methods include, for example, batch reflow soldering of surface mount components, local soldering of insert mount components after batch reflow soldering of surface mount components, and local reflow soldering of surface mount components and insert mount components.

A conventional reflow device for batch reflow soldering of surface mount components is constituted so as to melt solder and to solder electronic components by uniformly heating a printed circuit board with the radiant heat of a panel heater and hot air heated to a prescribed temperature.

Also, the reflow device according to the report of Japanese Patent Publication No. 7-73790 is an example of a reflow device for local heating and reflow of surface mount components and insert mount components. As shown in FIG. 11, this reflow device (50) is equipped with the following: hot air chamber (53) installed on the lower side of the transport path (52) for the printed circuit board (51) which collects gas heated to a temperature at which solder cream melts, an upper plate (57) installed to cover the opening section (54) of the hot air chamber (53) and in which is formed a plurality of hot air blow holes (56) to blow the hot air (55) selectively on only the necessary sections of the printed circuit board (51), and means for transport (58) to supply and remove the printed circuit board (51).

Because heating is local, this reflow device (50) makes possible the following processes: sectional soldering, soldering of components with low heat resistance, and concurrent soldering of lead components (59) and chip components (60) wherein the lead terminals protrude from the lower surface of the board.

However, batch reflow soldering is not possible when using the aforementioned, conventional type of reflow device if electronic components with low heat resistance are present together on a printed circuit board. Those components with low heat resistance among the electronic components will be damaged if that printed circuit board undergoes batch reflow soldering with the reflow device; therefore, the components with low heat resistance among the electronic components must be soldered separately, resulting in the problem of decreased productivity of the mounting process.

Meanwhile, the reflow device (50) shown in FIG. 11 makes possible batch soldering for a printed circuit board (51) on which electronic components with low heat resistance are present together by locally blowing hot air without blowing the hot air to the locations of the electronic components with low heat resistance.

Actually, batch soldering of the electronic components (lead component (59) and chip component (60), etc.) placed on the entire surface of the printed circuit board (51) is not possible for the following reason. In effect, reflow soldering electronic components such as lead component (59) and chip component (60), etc., with the reflow device (50) requires heating to temperatures in the vicinity of 230° C. for 20–30 seconds. Hot air of a temperature of roughly 350° C. or greater is necessary to ensure the quantity of heat necessary for that purpose. In hot air of such high temperatures, areas of the printed circuit board (51) in which the temperature rises easily reach temperatures approaching that of the hot air. Even heat resistant components (for example, the temperature of heat resistance for QFP is 250° C. (QFP is heat resistant to temperatures of 250° C.) cannot withstand that temperature. When the hot air temperature is reduced to 250° C., the temperature of heat resistance, in order to avoid [damage], the risk is that areas of the printed circuit board (51) in which the temperature rises with difficulty are not heated to the temperatures necessary for soldering within a prescribed period of time and high reliability soldering may not result.

DISCLOSURE OF THE INVENTION

An object of the present invention is to provide a reflow method and reflow device which resolve the problems and make possible batch soldering with high reliability and without resulting in heat damage to electronic components on the printed circuit board.

In order to solve the problems, the reflow method of the present invention is a reflow soldering method in which hot air is blown locally and roughly perpendicular to locations to be connected on one surface of a printed circuit board, concurrent with radiant heating of the surface of a printed circuit board, on which electronic components are loaded and to which solder cream has been applied at locations to be connected.

This reflow method permits secure soldering in such a manner that the temperature of the hot air does not exceed the temperature of heat resistance of the electronic components because of its combination with the radiant heat. Moreover, this reflow method can permit soldering in such a manner that only those points to be connected are heated selectively because the hot air is blown locally and roughly perpendicular to the points to be connected. This reflow method prevents heat damage to sections other than the points to be connected and ensures that the solder at the points to be connected is melted.

Additionally, the reflow method of the present invention permits batch reflow soldering of electronic components, on a printed circuit board to which solder cream is applied, because the surface to undergo reflow soldering of the printed circuit board is heated while the components with low heat resistance, among the electronic components on the printed circuit board, are cooled.

Since reflow soldering is performed while the components with low heat resistance among the electronic components are cooled, this reflow method can prevent damage to the components with low heat resistance among the electronic components and can perform batch reflow soldering of electronic components on a printed circuit board. Consequently, performing reflow soldering for operations conducted with conventional flow dip soldering improves soldering quality. In effect, the flow method results in a two-time heat history since the printed circuit board passes through the flow device after passing through a curing oven in order for temporary affixation of surface mount components with adhesive. However, in the method of the present invention, the board needs to only pass once through the reflow device. This results in a one time heat history and prevents deterioration of the capacity of the electronic components. Also, when surface mount electronic components are placed on both surfaces of the printed circuit board, points to be connected of the electronic components on the lower surface are cooled during reflow; therefore, those electronic components will not drop off even if they are not affixed with adhesive. Consequently, the process for applying adhesive when the surface mount electronic components are placed thereon can be eliminated.

Also, in the aforementioned reflow method, the electronic components placed on the printed circuit board include surface mount components and insert mount components. The present invention permits batch reflow soldering of these surface mount components and insert mount components.

This reflow method makes possible reflow soldering of lead insert mount components which before now could not pass through a reflow device which heats the entire board. Consequently, production costs do not rise because insert mount components can be used without further processing.

Also, in the aforementioned reflow method, the present invention heats one surface of the printed circuit board while cooling the other surface of the printed circuit board.

With this reflow method, reflow soldering can be performed without impediment even if components with low heat resistance are on the other side.

The reflow device of the present invention has the following placed together in a heating section: means for radiant heating, for radiant heating of one surface of the printed circuit board, to which solder cream is applied at points to be connected and on which electronic components are placed; and means for hot air heating, to blow hot air locally and in a direction roughly perpendicular to the points to be connected on one surface of the printed circuit board, which is being heated by that means for radiant heating.

This reflow device can put into practice the aforementioned reflow method by supplying a printed circuit board to the heating section because the following are placed together in the heating section: means for radiant heating, for radiant heating of one surface of the printed circuit board, and means for hot air heating, to blow hot air locally and roughly perpendicular to the points to be connected on that surface of the printed circuit board.

Additionally, the present invention is that in which means for hot air heating is constituted of a hot air header forming a flat space touching the surface of the panel heater on the side of the printed circuit board and in which is located a mask plate, in which are formed blow holes corresponding to the points to be connected on the surface in opposition to the printed circuit board; and means for supplying hot air, to supply the hot air to within the hot air header from the side section thereof, in the aforementioned reflow device.

With this reflow device, radiant heat from means for radiant heating is definitely radiated through the hot air header to the printed circuit board, while hot air is definitely blown from the mask plate locally and roughly perpendicular to the points to be connected.

Also, the present invention is constituted in such a manner that, in the aforementioned reflow device, a dispersion plate in which a plurality of through holes are dispersed is placed with space between [itself and] the mask plate inside the hot air header and hot air is supplied from means for supplying hot air into the space between means for radiant heating and the dispersion plate.

With this reflow device, a flow of hot air inside the hot air header is homogenized with the dispersion plate, ensuring that the hot air is blown uniformly and appropriately against and roughly perpendicular to the points to be connected.

Also, in the aforementioned reflow device, a black body paint coating is made on the mask plate; therefore, the present invention can improve the quantity of radiant heat with this reflow device.

Also, means for cooling to blow cool air to prescribed locations of the other surface of the printed circuit board, one surface of which is being heated with means for radiant heating and means for hot air heating, is installed in the aforementioned reflow device; therefore, the present invention can contribute to the operation by blowing the cool air as mentioned above.

Also, the aforementioned reflow device is equipped with means for transporting, to transport the printed circuit board in the heating section, and lifting means for lifting and lowering boards, to lift the printed circuit board in the heating section to a prescribed heating position; therefore, the present invention can provide heating quickly and with good precision by lifting the printed circuit board to a heating position with this reflow device.

Also, the aforementioned reflow device has means for cooling installed in lifting means for lifting and lowering boards; therefore, the present invention can appropriately cool prescribed locations on the other surface of a printed circuit board with this reflow device.

Also, the aforementioned reflow device has an isolation plate to isolate the cooling atmosphere and the heating atmosphere surrounding the periphery of the printed circuit board, which is lifted to a prescribed heating position by lifting means for lifting and lowering boards; therefore, the present invention can heat and cool efficiently and with good precision and without intermixing of the cool air and hot air.

Also, the reflow device of the present invention is equipped with a heating section, to heat with means for heating a printed circuit board on which electronic components are placed, and a cooling section, to cool with means for cooling components with low heat resistance among the electronic components on the printed circuit board, which is being heated in the heating section.

Because reflow soldering during cooling of components with low heat resistance among the electronic components is possible, this constitution can prevent damage to components with low heat resistance among the electronic components and perform batch reflow soldering of electronic components on the printed circuit board.

Also, the present invention has means for transporting, to transport a printed circuit board in the heating section, installed in the aforementioned reflow device and means for cooling, arranged freely within a proximate space with respect to a printed circuit board which is transported in the heating section.

With this constitution, means for cooling can come to a proximate position as necessary and perform the cooling action at an appropriate position; at the same time, obstruction of the transport action by means for cooling can be avoided.

Also, in the present invention, the aforementioned reflow device is equipped with the following as means for heating of the heating section: a radiant heating element, such as a panel heater, for radiant heating of the printed circuit board and a hot air producing element for convection heating of a printed circuit board.

This constitution makes possible more appropriate heating of the printed circuit board. Basically, when the body of a lead insert mount component is cooled, a large quantity of the heat for heating the lead solder section is lost from the cooled body portion due to heat conduction. Consequently, this large quantity of lost heat and heat to raise the temperature of the lead solder section to nearly 200° C., greater than the solder melting temperature (183° C. for eutectic solder), must be supplied with a set amount of time (for example, approx. 20–30 seconds of the main reflow heating time). Here, in the case of using hot air as means of supplying heat, means to raise the temperature of the hot air or to accelerate the speed at which the hot air strikes the solder section is used in order to supply a large quantity of thermal energy in a short period of time. Because lead insert mounted components and surface mounted components are arranged on the heated surface of the printed circuit board by means of solder cream, means of accelerating the speed of the hot air is not used in consideration of the possible displacement of surface mounted components. In the case of using means to raise the temperature of the hot air, it is necessary that the temperature of the hot air be in the vicinity of 350° C. However, the lead insert components and surface mount components are arranged on the heated surface of a printed circuit board; hot air at a high temperature will heat the surface mount components, which are not subject to cooling, to a temperature greater than their temperature of heat resistance and destroy them. Therefore, a panel heater to generate infrared rays, which are radiant heat, is used as means to supply heat. The temperature of the panel heater may be increased in order to supply a large quantity of thermal energy in a short period of time.

Also, in the present invention, the aforementioned reflow device is constituted to heat one surface of a printed circuit board with means for heating of a heating section and cool the other surface of the printed circuit board with means for cooling of a cooling section. A plate, to prevent the intermixing of the heated atmosphere of the heating section and the cooled atmosphere of the cooling section, which surrounds the printed circuit board is arranged roughly parallel to the board transport surface in the aforementioned reflow device.

This constitution prevents the intermixing of the heated atmosphere of the heating section and the cooled atmosphere of the cooling section.

Also, in the present invention, the following are arranged above the board transport surface in the aforementioned reflow device: a plate to prevent intermixture of the heating-cooling temperatures, having a punched hole of a size greater than that of the exterior dimensions of the board; a board stopping mechanism, to stop a printed circuit board at a prescribed position relative to the aforementioned punched hole; and a mechanism to lift and lower a board, to lift a board to a height in contact with or near the aforementioned plate, to prevent intermixture of the heating-cooling temperatures.

This constitution can satisfactorily lift a printed circuit board from a board transport surface to a height in contact with or near the aforementioned plate to prevent intermixture of the heating-cooling temperatures and can more surely prevent the intermixture of the heated atmosphere of the heating section and the cooled atmosphere of the cooling section.

Also, the present invention has a cool air blowing structure, for local cooling of the components with low heat resistance mounted on a printed circuit board, installed on the mechanism to lift and lower a board in the aforementioned reflow device.

This constitution can allow for cooled locations to be made appropriate, because the cool air is blown corresponding to the arrangement of the components with low heat resistance on the printed circuit board.

Also, in the present invention, holes, corresponding to the arrangement of components with low heat resistance on a printed circuit board, are made in a plate as a cool air blowing structure in the aforementioned reflow device.

This constitution can allow for cooled locations to be made appropriate, as cool air is blown appropriately from the holes, as a cool air blowing structure, on components with low heat resistance on a printed circuit board.

Also, in the present invention, a nozzle to adjust the distance from the cooled sections of a printed circuit board is installed in the aforementioned reflow device.

This constitution can allow for cooled locations to be made appropriate, because the constitution can more appropriately realize a cool air blowing structure corresponding to the arrangement of components with low heat resistance on a printed circuit board.

Also, in the present invention, the aforementioned reflow device has blow holes, made in a metal or resin block, as a cool air blowing structure; therein, the carving of the block adjusts the cool air blowing distance in accord with the height of the insert mount components.

This constitution can allow for cooled locations to be made appropriate, because the constitution can more appropriately realize a cool air blowing structure corresponding to the arrangement of components with low heat resistance on a printed circuit board.

Also, in the present invention, the aforementioned reflow device is equipped with a heating section, consisting of a preheating section and a main heating section, to heat a printed circuit board on which electronic components are placed and a transport section, to transport a printed circuit board. The following are installed in that preheating section: a heat source to preheat a reflow soldering surface, being one surface of a printed circuit board (the upper surface, for example); an exhaust duct to exhaust, in a direction roughly parallel to the printed circuit board and roughly at right angles to the direction of transport, the atmosphere of the other surface (the lower surface, for example) of a printed circuit board, which is especially not to undergo forced heating; and an external air intake placed on the other side of the aforementioned printed circuit board, for example, below the board transport surface, to maintain this other surface at a low temperature.

This constitution can maintain the atmospheric temperature of the lower surface of a board at about room temperature and can heat the upper surface of a board, while maintaining the bodies of insert mount components at a low temperature.

DETAILED DESCRIPTION OF THE PREFERRED EMBODIMENTS

Below the embodiment of the present invention is explained using FIGS. 1 through 10.

Figure 1:
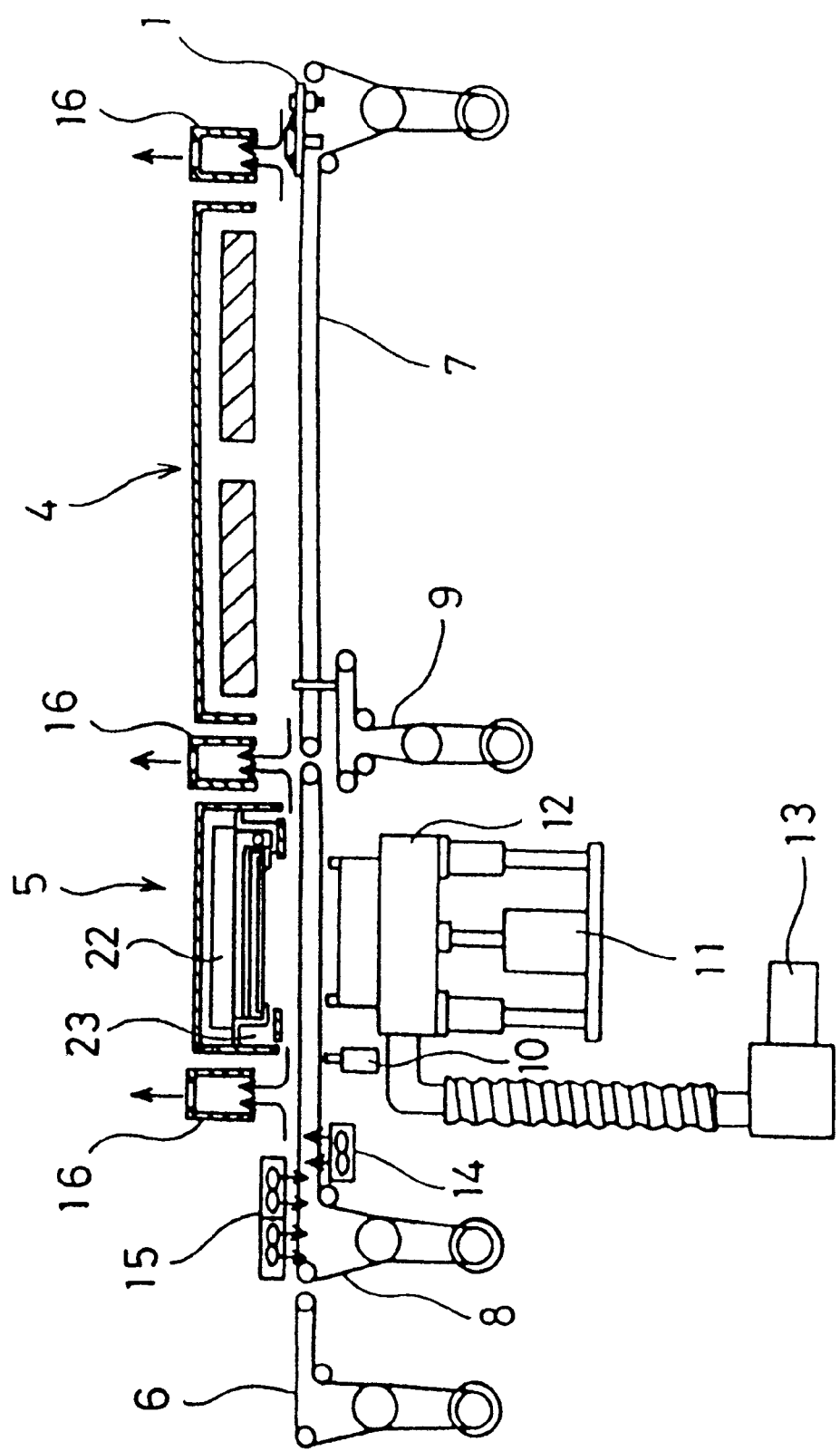
FIG. 1 is a cross section to show the basic constitution of the entire reflow device based on the embodiment of the present invention.
Figure 2:
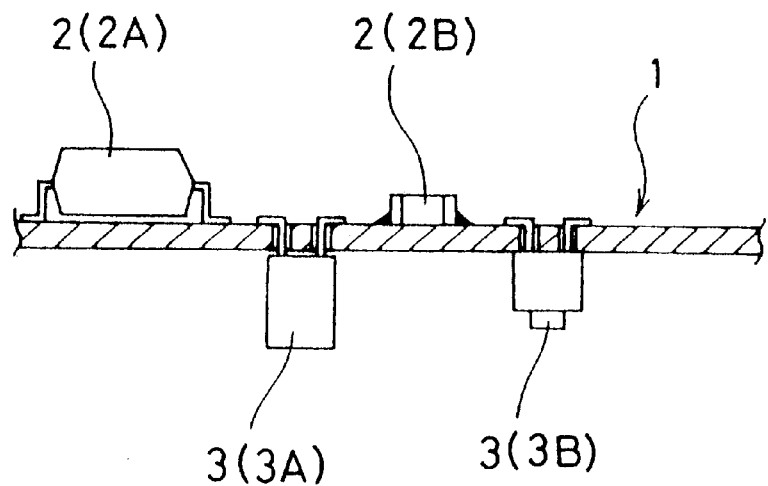
FIG. 2 is a cross section to show a printed circuit board in a state with surface mount components and insert mount components present together.

In FIG. 1, (1) shows a printed circuit board which is preheated in a preheating section (4) and then supplied to a main heating section (5), where it undergoes reflow soldering; afterwards the printed circuit board (1) is transported out with the exit conveyor (6). As shown in FIG. 2, surface mount components (2), such as QFP (2A) and chip component (2B), and insert mount components (3), such as aluminum electrolytic capacitor (3A) and switch component (3B), are placed together on the printed circuit board (1). This printed circuit board (1) is transported in the reflow device in a position such that the body sections of the insert mount components (3) are located on the lower side of the printed circuit board (1).

As means for transporting, conveyors (7) and (8) pass through the preheating section (4) and the main heating section (5) respectively. The conveyor (7) transports the printed circuit board (1) at a prescribed speed through the preheating section (4). The conveyor (8) transports the printed circuit board (1) at a quick speed to and from a prescribed position in the main heating section (5). Means for pushing boards (9), to push the printed circuit board (1) which has reached the terminus of the conveyor (7) onto the conveyor (8), is placed between the conveyors (7) and (8).

A board stopper (10), as a board stopping mechanism to stop the printed circuit board (1) at a prescribed position, is placed near the board transport surface of the main heating section (5). Placed below the board transport surface of the main heating section (5) are a cooling device (12), which supports the printed circuit board (1) while blowing cool air onto and cooling prescribed locations thereon; a ventilation fan (13) to ventilate this cooling device (12); and a raising and lowering cylinder (11), as means to lift and lower boards, for lifting and lowering the cooling device (12) and carrying the printed circuit board (1) to a prescribed heating position.

Cooling fans (14) and (15), to move air above and below and cool the printed circuit board (1), are located at the terminus of the conveyor (8) on the downstream side of the main heating section (5). Also, exhaust ducts (16) are located between and at either end of the preheating section (4) and the main heating section (5).

Figure 3:
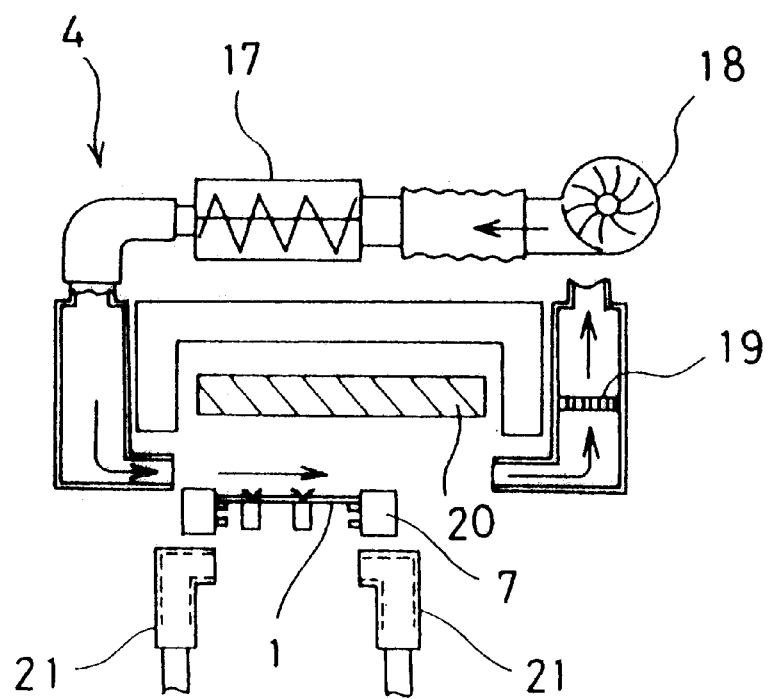
FIG. 3 is a cross section to show a preheating section of the reflow device shown in FIG. 1.

As shown in FIG. 3, the preheating section (4) is constituted of a hot air heater (17), to produce hot air; a hot air recirculation fan (18), to send the hot air from one side and along the upper surface of the printed circuit board (1); a catalyst (19) located on the hot air recirculation path and which burns off fumes of the flux and solvents produced from the solder cream, for example, during the heating of the printed circuit board (1); a panel heater (20), located in the upper section of the board transport path of the conveyor (7), for radiant heating of the upper surface of the printed circuit board (1); and an atmosphere exhaust duct (21), located in the lower section of the transport path.

Figure 4:
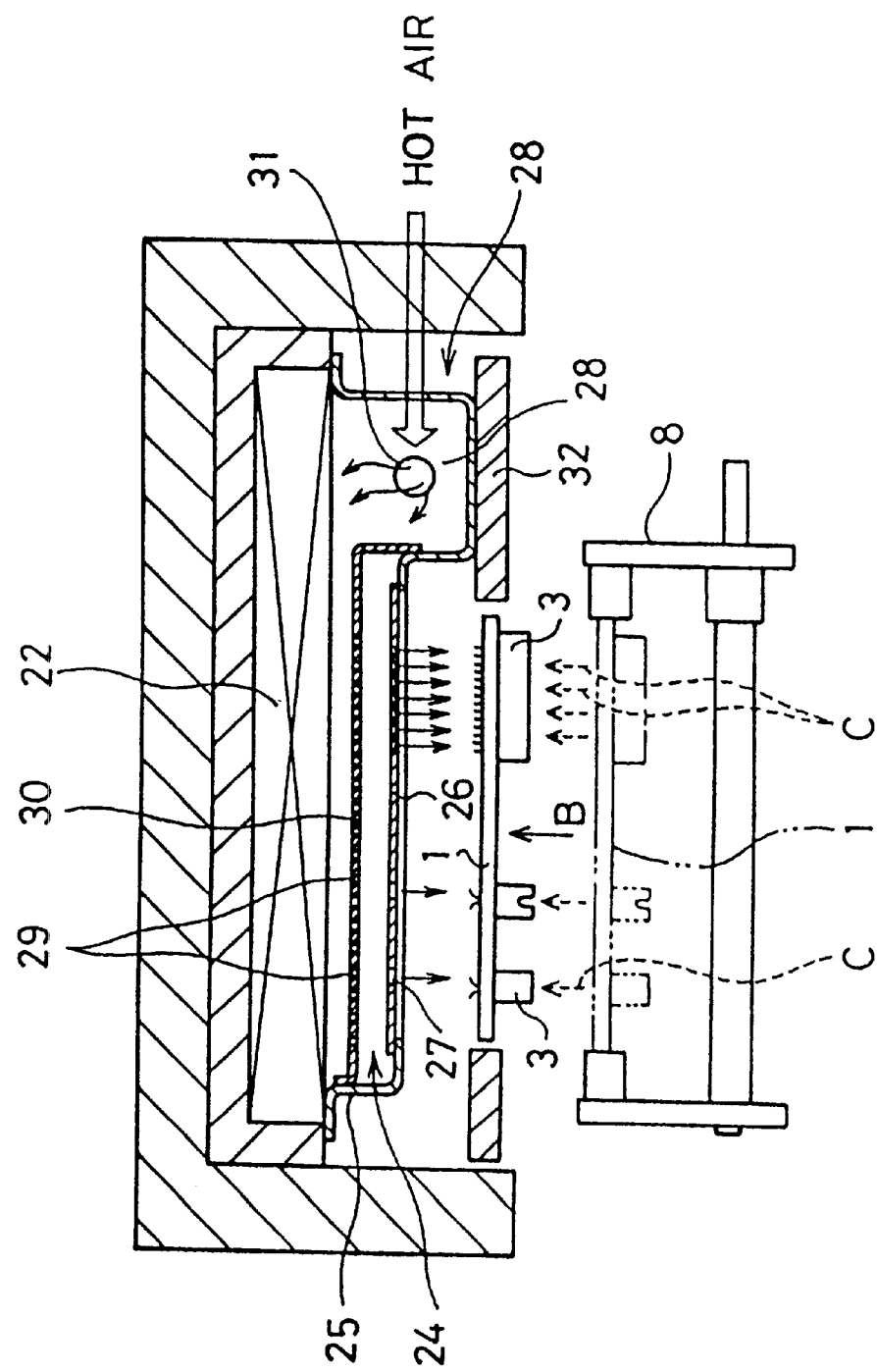
FIG. 4 is a cross section to show the principal elements of a main heating section of the reflow device shown in FIG. 1.

As shown in FIG. 4, the main heating section (5) has a panel heater (22), as means of radiant heating for the surface of the printed circuit board (1), and means for hot air heating (23), for blowing hot air locally and roughly perpendicular to the points to be connected on the surface of this printed circuit board (1). Means for hot air heating (23) is equipped with hot air header (25), forming a flat space (24) and touching the lower surface of the panel heater (22); a mask plate (26), placed on a surface of this hot air header (25) opposite the printed circuit board (1), wherein blow holes (27), corresponding to the points to be connected are formed, and on which a black body paint coating is made; and a hot air supply duct (28), to supply hot air within the hot air header from one side thereof.

Figure 5:
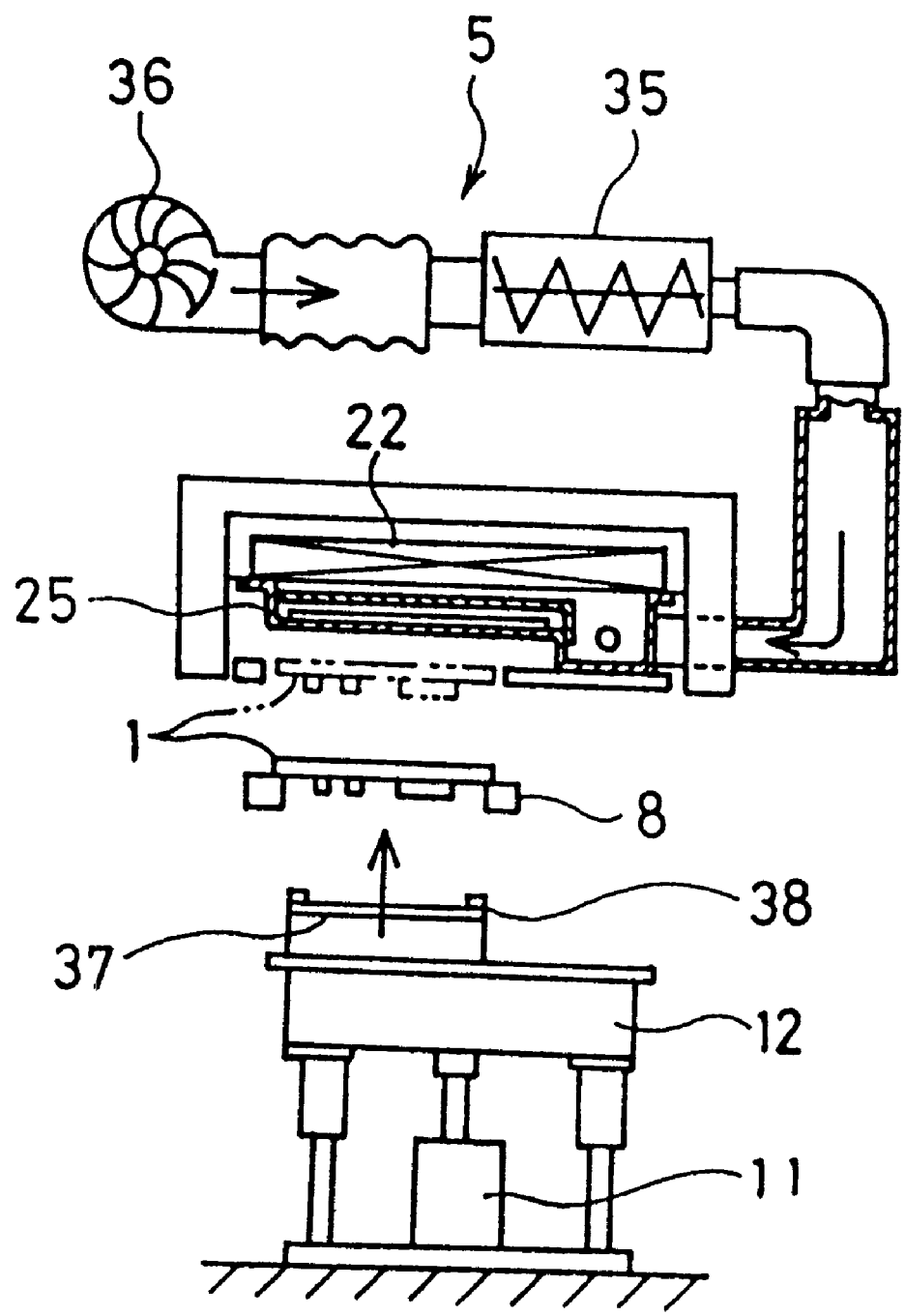
FIG. 5 is a cross section to show a basic constitution of a main heating section of the reflow device shown in FIG. 1.

Within the hot air header (25), a dispersion plate (30), on which a plurality of through air holes (29) is dispersed, is placed with space between itself and the mask plate (26). Hot air is supplied from the hot air supply duct (28) to between the dispersion plate (30) and the panel heater (22). Hot air sources such as the hot air heater (35) and the hot air ventilation fan (36) pass through the hot air supply duct (28) as shown in FIG. 5. Meanwhile, as shown in FIG. 4, a hot air nozzle tube (31), to blow hot air uniformly from its entire length, is placed inside the hot air supply duct (28).

Figure 6A:
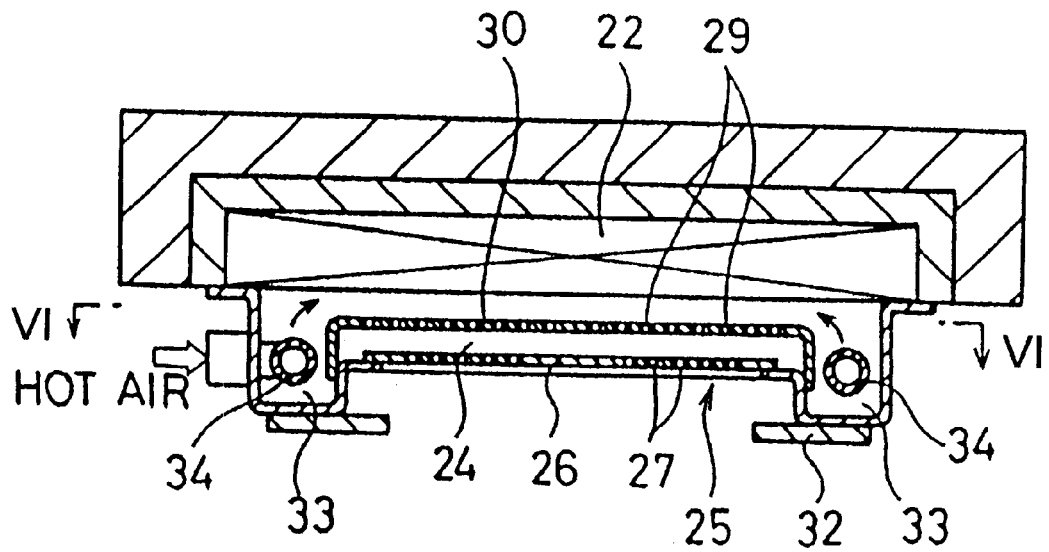
FIG. 6(a) is a cross section to show the principal elements of a main heating section of the reflow device shown in FIG. 1.
Figure 6B:
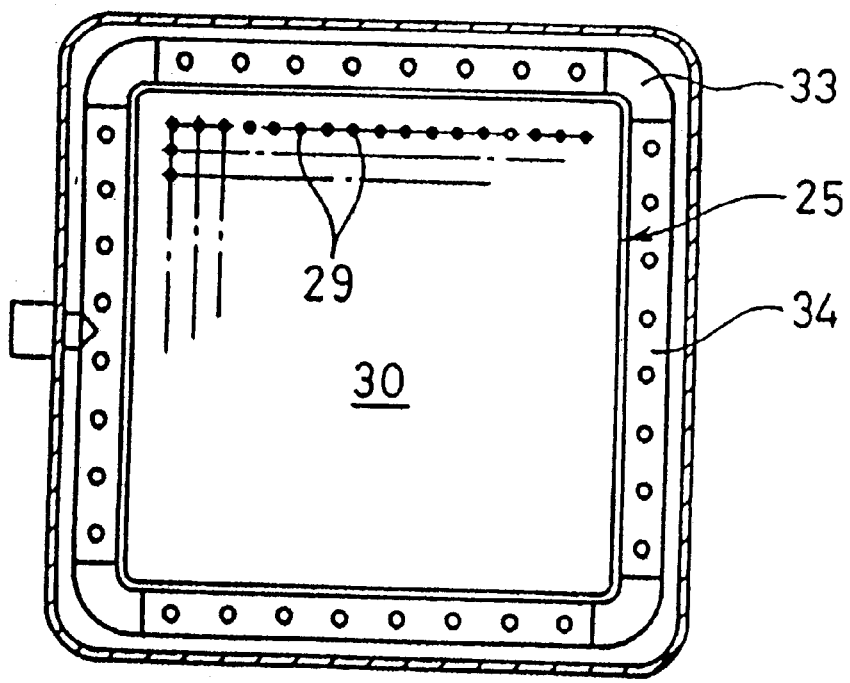
FIG. 6(b) is a plane diagram to show the principal elements of a main heating element of the reflow device as seen from Line VI—VI in FIG. 6(a)

Moreover, in the example shown in FIG. 4, the hot air supply duct (28) is placed on one side of the hot air header (25), but the present invention is not limited to that. For example, as shown in FIG. 6, the constitution may also be such that a hot air supply duct (33) is placed so as to surround the periphery of the hot air header (25) and a rectangular, annular hot air nozzle tube (34) is placed therein to send hot air from the hot air source to the right place. Such a structure can form a more uniform hot air and permit hot air heating with good precision.

Figure 7A:
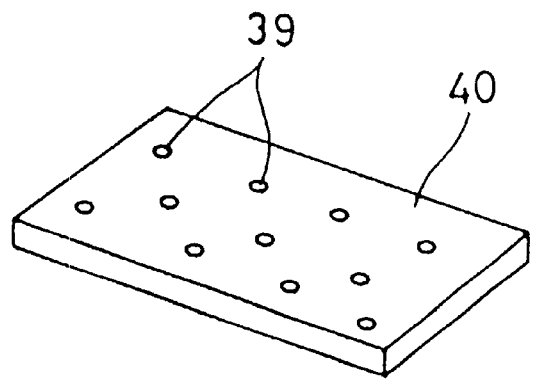
FIGS. 7(a), 7(b), 7(c), and 7(d) are respectively oblique views and cross sections of the arrangement of holes for local cooling of the reflow device shown in FIG. 1.
Figure 7B:
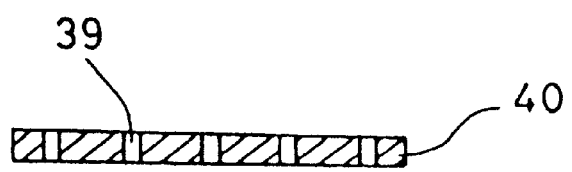
Figure 7C:
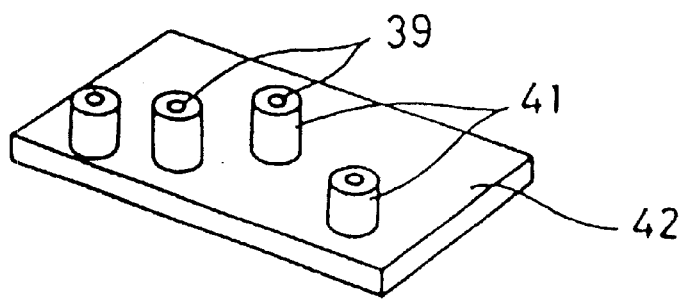
Figure 7D:
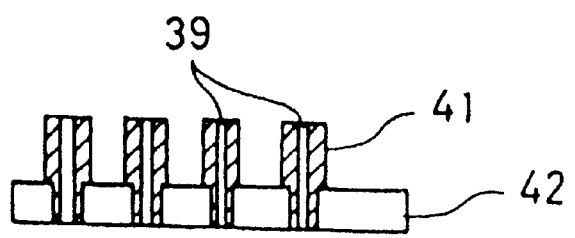
Figure 8:
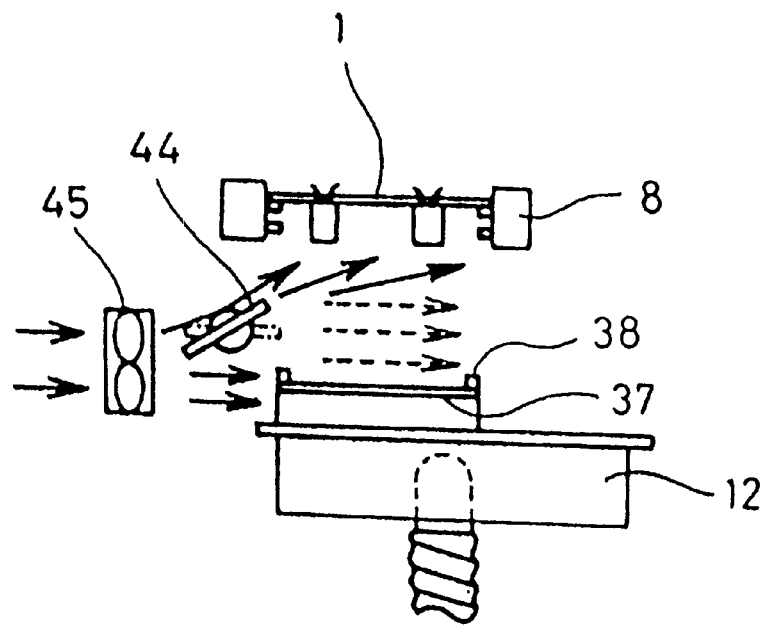
FIG. 8 is a figure to show the structure of the vicinity of a cooling device in the reflow device shown in FIG. 1.

A section with small holes (37) for local cooling, in which small holes to blow cool air are installed, and a board support element (38), to support the printed circuit board (1), are placed in the cooling device (12). As shown in FIGS. 7(a) and (b), the section with small holes (37) may be constituted with a flat plate (40) in which holes (39) are made, or may have a structure with nozzles (41), conforming to the height of the printed circuit board (1), mounted on a plate (42) for blowing cool air from holes (39) in the nozzles (41), as shown in FIGS. 7(c) and (d). Here, the distance from the nozzles (41) to the cooled sections of the printed circuit board (1) may be adjusted. Also, blow holes may be made in a metal or resin block and the cool air blowing distance, corresponding to the height of the insert mount components (3), may also be adjusted by the carving of the block. As shown in FIG. 8, a fan (45), to ventilate the lower surface of the board with some of the air stream by the wind direction plate (44), may also be installed in the cooling section where the cooling device (12) is installed.

As shown by the solid line in FIG. 4, an isolation plate (32) is installed at a position where it surrounds the periphery of that printed circuit board (1) when the raising and lowering cylinder (11) has raised the printed circuit board (1) to a prescribed heating position. This isolation plate (32) prevents the intermixing of the heating atmosphere for the upper section of the printed circuit board (1) and the cooling atmosphere from the cool air, as shown by the broken arrow (C) from means for cooling (12) in the lower section.

Figure 9A:
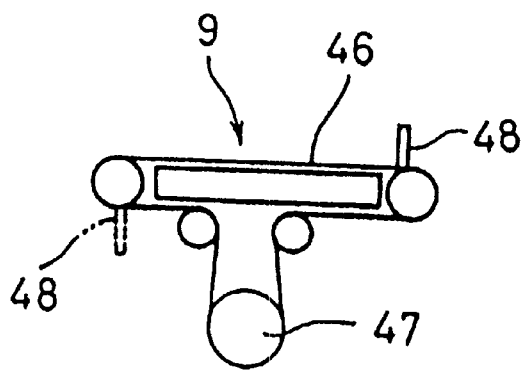
FIGS. 9(a) and 9(b) are respectively cross sections of the board pushing sections of the reflow device shown in FIG. 1.
Figure 9B:
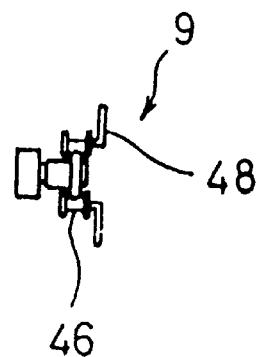

As shown in FIG. 9, means for pushing boards (9) is constituted of a chain (46), a driving motor (47), and a lever (48) affixed to the chain (46).

The operation of the reflow device, constituted as noted above, is explained.

The conveyor (7) transports the printed circuit board (1), on which surface mount components (2) and insert mount components (3) are present together, at a certain speed into the preheating section (4). Inside the preheating section (4), the entire upper surface of the printed circuit board (1) is heated to a temperature in the vicinity of 150° C. with the radiant heat from the panel heater (20) and the side flow hot air stream. The load on the hot air heater (17) is reduced because the hot air of a certain temperature is recirculated, while regularizing the temperature of the atmosphere within the preheating section (4). The temperature of the body sections of the insert mount components (3), which are transported in a position on the lower surface of the printed circuit board (1), is increased by the conduction of heat from the lead sections on the upper surface of the printed circuit board (1). With the constitution in which the atmosphere exhaust duct (21) continually takes in the atmosphere of the lower surface of the printed circuit board (1), room temperature atmosphere is guided to the lower surface of the printed circuit board (1), draws heat from the body sections of the insert mounted components (3), and suppresses temperature increases of the body sections.

Having completed preheating, the printed circuit board (1) reaches the terminus of the conveyor (7) where means for pushing boards (9) pushes the rear end of the printed circuit board (1) and smoothly transfers the printed circuit board (1) to the conveyor (8). Means for pushing boards (9) is established in this way because it is necessary to transport the printed circuit board rapidly; the conveyor (7) is moved at a speed of 0.8 m/min, for example, because the printed circuit board (1) is heated while it is transported continuously through the preheating section (4), through which the conveyor (7) runs, but the printed circuit board (1) is stopped at a prescribed position with the board stopper (10), raised to a prescribed heating position by the raising and lowering cylinder (11), and is heated in the main heating section (5), in which a separate conveyor (8) is operating.

The printed circuit board (1), transported into the main heating section (5), is stopped at a prescribed position with the board stopper (10) and the conveyor (8) is also stopped. Then means for cooling (12) is raised by the raising and lowering cylinder (11) and the printed circuit board (1), which is supported on the upper end thereof, is raised to a prescribed heating position surrounded by the isolation plate (32).

In this state, the upper surface of the printed circuit board (1) is heated through the heat header (25) with the radiant heat from the panel heater (22). At the same time, hot air is blown from the blow holes (27) of the mask plate (26), in means for hot air heating (23), locally and roughly perpendicular to the points to be connected of the surface mount components (2) and the lead sections, etc., of the insert mount components (3). Consequently, the points to be connected only can be heated quickly and with good precision to the prescribed temperature with hot air of a temperature which does not exceed the temperature of heat resistance of the surface mount components. The solder cream of the points to be connected melts and reflow soldering is performed. Also, the insert mounted components (3), positioned on the lower surface of the printed circuit board (1), are cooled with the section with small holes (37) for local cooling, in which holes (39) to blow cool air are installed corresponding to the position of the insert mounted components (3).

Figure 10A:
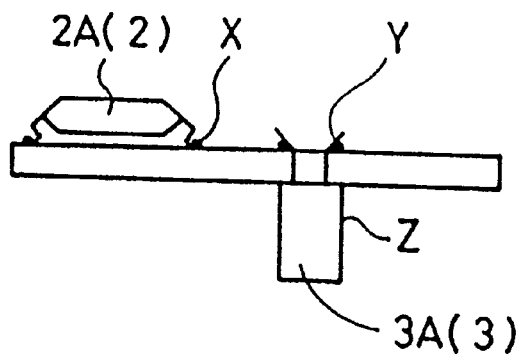
FIG. 10(a) is a side view of a printed circuit board on which electronic components are place to show the point at which temperature is measures.
Figure 10B:
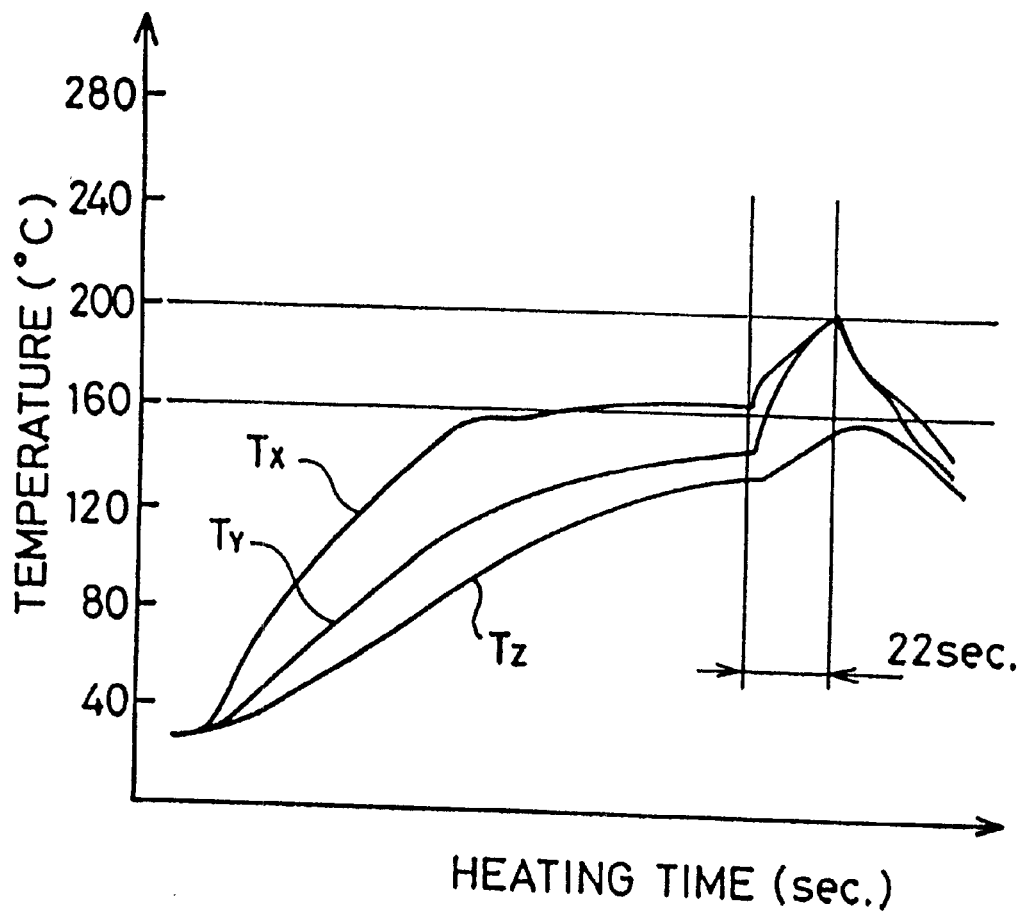
FIG. 10(b) is a figure to show the temperature characteristics of each point at which temperature is measured for the electronic components with respect to heating time.
Figure 11:
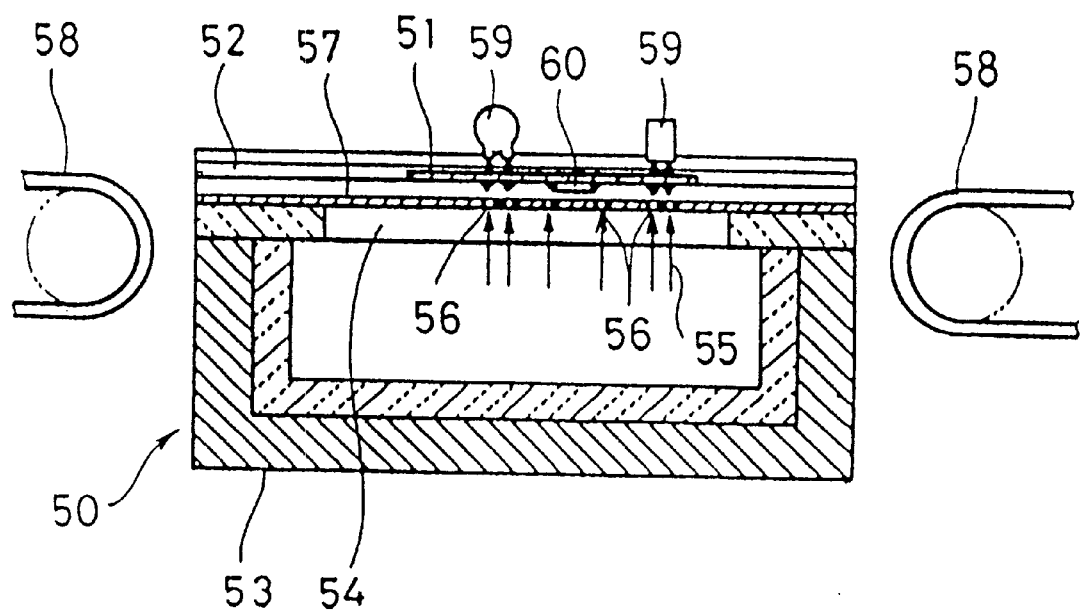
FIG. 11 is a cross section of the principal elements of a conventional reflow device.

With this structure, as shown in FIGS. 10(a) and (b), the temperature $T_X$ of the point to be connected X in the lead of the QFP (2A), as one example of a surface mount component (2), and the temperature $T_Y$ of the point to be connected Y in the lead of the aluminum electrolytic capacitor (3A), as one example of an insert mount component (3), are 200° C. or greater. The solder cream of the points to be connected melts satisfactorily and reflow soldering is performed with certainty. Meanwhile, the temperature $T_Z$ of the body section Z of the aluminum electrolytic capacitor (3A) becomes 160° C. or less and heat damage to the aluminum electrolytic capacitor (3A) can be prevented with certainty.

In this way, since the radiant heating and hot air heating act together concurrently, soldering can be performed with certainty even though the temperature of the hot air does not exceed the temperature of heat resistance of the electronic components. Meanwhile, hot air is blown locally and roughly perpendicular to the points to be connected and only those points to be connected are selectively heated. While heat damage to sections other than points to be connected is prevented, the solder of the points to be connected can be definitely melted again and result in soldering; soldering with high reliability is ensured.

Also, damage to components with low heat resistance, such as the body sections of insert mounted components (3), among the electronic components can be prevented and batch reflow soldering of electronic components on the printed circuit board (1) can be performed. Also, since the mask plate (26) is installed between the panel heater (22) and the printed circuit board (1), the supply of radiant thermal energy to surface mount components (2), which are not subject to cooling, can be isolated and the temperature increase can be controlled. The isolation plate (32) can also prevent the intermixing of the cooling atmosphere and the heating atmosphere of the main heating section (5).

When the prescribed heating operation is complete, the printed circuit board (1) is lowered to the position of the conveyor (8) once more and the level of the cooling device (12) is dropped below that. In effect, the cooling device (12) is lowered and the heating of the cooling device (12) itself by the radiant heat is suppressed by its separation of the panel heater (22). When the cooling device (12) begins to drop, the cooling of the insert mount components (3) is insufficient. To compensate for this, the lower surface of the printed circuit board (1) is ventilated with some air from the fan (45) by the wind direction plate (44). Moreover, when the printed circuit board (1) is transported from the main heating section (5), the wind direction plate (44) is set horizontally and the cooling device (12) is cooled with wind from the fan (45).

Also, the printed circuit board (1) is transported from the main heating section (5) with the conveyor (8) and is cooled with the cooling fans (14) and (15). Then the printed circuit board (1) transfers to the exit conveyor section (6) from the conveyor (8) and is transported to the exit of the reflow device.

What is claimed is:

1. A reflow method for reflow soldering of electronic components onto a printed circuit board on which a cream solder is supplied, comprising:

heating a to-be-soldered surface of a printed circuit board while cooling electronic components having a low heat resistance among the electronic components on the printed circuit board, wherein the printed circuit board is stopped at a predetermined position of a heating section, and one surface of the printed circuit board is heated while the other surface thereof is cooled.

2. The reflow method according to claim 1, wherein the electronic components placed on the printed circuit board include surface mount components and insert mount components, and these surface mount components and insert mount components undergo batch reflow soldering.

* * * * *